United States Patent [19]

Hewitt et al.

[11] Patent Number: 4,523,326
[45] Date of Patent: Jun. 11, 1985

[54] LOW NOISE CHARGE COUPLED IMAGER CIRCUIT

[75] Inventors: Mary J. Hewitt, Playa del Rey; Arthur L. Morse, Manhattan Beach, both of Calif.

[73] Assignee: Hughes Aircraft Company, El Segundo, Calif.

[21] Appl. No.: 458,607

[22] Filed: Jan. 17, 1983

[51] Int. Cl.³ ............ G11C 19/28; H01L 29/78; H01L 27/14; H01L 31/00
[52] U.S. Cl. .................................. 377/58; 377/60; 357/24; 357/30
[58] Field of Search ............. 357/24, 30; 377/57–63; 307/311

[56] References Cited

U.S. PATENT DOCUMENTS

| | | | |
|---|---|---|---|
| 3,683,193 | 8/1972 | Weimer | 357/24 LR |
| 3,925,657 | 12/1975 | Levine | 357/24 LR |
| 3,931,463 | 1/1976 | Levine | 357/24 LR |
| 4,010,319 | 3/1977 | Levine | 357/24 LR |
| 4,145,721 | 3/1979 | Beaudouin et al. | 357/24 LR |
| 4,245,164 | 1/1981 | Funahashi | 357/24 LR |
| 4,482,909 | 11/1984 | Heald | 357/24 LR |

Primary Examiner—Gene M. Munson
Attorney, Agent, or Firm—Mark J. Meltzer; A. W. Karambelas

[57] ABSTRACT

Noise reduction and dynamic range expansion in a CCD imager is achieved by combining a narrow FAT zero metering gate with a reference column subtraction and CCD charge bailing.

4 Claims, 11 Drawing Figures

LOW NOISE CHARGE COUPLED IMAGER CIRCUIT

BACKGROUND OF THE INVENTION

Charge coupled device imagers formed on a semiconductor substrate are described in Wolfe et al, *The Infrared Handbook*, Office of Naval Research, Department of the Navy, 1978, pp. 12-27 to 12-54. They typically comprise an array of parallel charge coupled device (CCD) serial registers receiving charge from adjacent photodetectors on the substrate. Typically, the parallel CCD registers are arranged in vertical columns, all of their outputs being connected to a single horizontal CCD register which serves as the multiplexer. All of the column CCD registers are connected to a common input diffusion and a common input gate which separately introduces a FAT zero charge packet into each of the column CCD registers.

This type of imager suffers from several inherent limitations. Specifically, electronic noise or jitter on the signals controlling the injection of the FAT zero charge packet from the input diffusion into each of the column registers causes the amount of FAT zero charge in each of the packets to vary, which in turn generates row correlated noise. Specifically, electronic jitter in the clock signals controlling the input diffusion and the adjacent overlying input gate electrodes causes the capacity of each CCD bucket defining the amount of FAT zero charge to vary in synchronism with the jitter.

Another limitation is the presence of thermal noise generated by the behavior of the semiconductor material. For example, semiconductor surface states at the interface between the semiconductor substrate and the overlying dielectric layer causes the amount of charge carriers contained in each CCD bucket to vary, which in turn generates uncorrelated thermal noise in the video signal.

The total amount of CCD noise from these two sources, $N_{CCD}$, is equal to the square root of the sum of the squares of the row correlated noise, $N_{RC}$, and the thermal noise, $N_{TH}$, in accordance with a well-known principle, which may be expressed as:

$$N_{CCD}=(N_{RC}^2+N_{TH}^2)^{\frac{1}{2}}.$$

Another limitation is that the limited charge capacity of each CCD bucket restricts the dynamic range of the imager. Specifically, an excessive amount of background radiation causes the photodetectors to generate so much charge as to saturate the charge carrying capacity of the CCD registers, thus causing the image to be washed out. Such an imager can operate over only a very limited range of background radiation levels. One prior art solution to this problem was to interpose a gain control device between each photodetector and its corresponding column CCD register. Such a gain control device could be adjusted to limit the amount of charge generated by the photodetector for a given amount of incident radiation. For example, if the background radiation level were to increase for some reason, the user could adjust the gain control device to decrease the detector gain in order to avoid saturating the charge coupled device capacity. This solution has the disadvantage that such a reduction in detector gain simultaneously causes a reduction in the signal-to-noise ratio in the output video signal for high background radiation levels, due to photon noise. For example, in accordance with well-known principles, if the detector current is reduced by one-half, the signal-to-photon noise ratio will be reduced by a factor of $(\frac{1}{2})^{\frac{1}{2}}$. Accordingly, in the prior art, saturation due to high intensity background radiation was avoided only at the expense of reduced signal-to-photon noise ratio.

Another problem with such imagers is that the clocking speed of the vertical column CCD parallel registers is limited by the clocking speed of the horizontal multiplexing CCD register to which they are all connected. Specifically, the clock frequency of the horizontal multiplexing register must be greater than the clocking frequency of the parallel vertical column registers by a factor proportional to the number of vertical columns in the array. The clock frequency of the horizontal multiplexing register is limited by the rise time of the CCD clock signal and the maximum speed the charge can be transferred, which places a fundamental limitation on the speed of such an imager. Also, transfer noise sets a limit on the performance of these devices due to the large number of transfers required to reach the output.

In summary, the dynamic range of a CCD imager is limited at extremely low background radiation intensities (such as those encountered in deep space) by the presence of thermal noise and row correlated noise. It is limited at very high background radiation intensities (such as those encountered on the ground in broad daylight) by the degradation of the signal-to-photon noise ratio caused by gain attenuation necessary to compensate for limited CCD charge capacity.

SUMMARY OF THE INVENTION

In the CCD imager of the present invention, all of the foregoing problems are virtually eliminated. The invention includes a low noise FAT zero injection circuit common to all column CCD registers where the entire CCD range can be exercised during setup and in which each FAT zero charge packet is metered by an overlying metering gate electrode of very small area in proportion to the depth of the surface potential well formed beneath the metering gate electrode during system operation. Reduction of the area of the metering gate electrode reduces fluctuations in the amount of charge stored beneath this electrode due to (1) electronic jitter in the applied voltage on the electrode and (2) surface state noise at the interface between the semiconductor substrate and the dielectric layer beneath the metering gate electrode.

Noise is further reduced by the use of reference column subtraction in which the output signal from each CCD column register is subtracted from the output signal of a reference CCD column register having no photodetector input. This subtraction suppresses noise by common mode rejection.

The outputs of a number of column CCD registers are further multiplexed by the use of a source follower common output circuit instead of the usual horizontal CCD multiplexing register. Substitution of a source follower circuit at the output of each CCD column register in place of the usual CCD multiplexing register facilitates the subtraction of each CCD column register output from the reference CCD column register output. It also removes the limitation in clocking frequency otherwise imposed by the horizontal CCD multiplexing register and eliminates transfer noise due to the horizontal CCD multiplexing register.

Row correlated noise, produced by electronic jitter in the applied voltage on the FAT zero metering gate, is reduced in proportion to the reduction in FAT zero metering gate area and in proportion to the common mode rejection ratio of the reference column subtraction feature. The reduction in thermal noise is also proportional to the reduction in FAT zero metering gate area. The foregoing may be expressed as follows:

$$N_{CCD} = ((N_{RC} \times (A'/A) \times CMR)^2 + (N_{TH} \times (A'/A))^2)^{\frac{1}{2}},$$

where $N_{CCD}$ is the total charge coupled device noise due to row correlated and thermal noise, $A'$ is the reduced area of the FAT zero metering gate, $A$ is the original or usual size of the FAT zero metering gate, CMR is the common mode rejection ratio of the reference column subtraction feature, $N_{RC}$ is the row correlated CCD noise corresponding to a FAT zero metering gate electrode area A, and $N_{TH}$ is thermal CCD noise corresponding to a FAT zero metering gate area A.

From the foregoing, it should be apparent that the total noise reduction achieved by the two features of reference row subtraction and FAT zero metering gate area reduction is a quadratic function so that the resulting reduction in total noise by their combination is greater than the combination of the noise reductions achieved separately in these two features.

The invention also includes a bucket bailer feature in which very bright backgrounds may be suppressed without degrading the signal-to-photon noise ratio. The signal is proportional to the number $N_0$ of photons impinging upon the photodetector. The photon noise is proportional to the square root of the number of photons, $(N_0)^{\frac{1}{2}}$, so that the signal-to-noise ratio in the presence of high background radiation is roughly equal to $N_0/(N_0)^{\frac{1}{2}} = (N_0)^{\frac{1}{2}}$. Prior art background filters, such as gain control circuits, which reduce either the number of photons, $N_0$, or photon-generated carriers, $N_0 \times$ quantum efficiency, necessarily reduce this signal-to-noise ratio. However, in the present invention, background radiation is suppressed to avoid saturating the CCD charge carrying capacity without reducing the signal generated by the photodetector.

This is achieved by a unique unit cell circuit in which charge generated by each photodetector is temporarily integrated in a CCD storage well before being input into the CCD column register. The unique feature is that, in the presence of high background radiation, this unit cell circuit has the ability to periodically "bail" or remove a predetermined amount of charge from the storage well a selected number of times during each integration period before the integrated charge is transferred into the CCD column register as a charge packet. The frequency at which the storage well is thus bailed may be selected by the user to accommodate any level of background radiation so that the storage well and the CCD column register are not saturated regardless of the intensity of the photo current generated by the photodetector. The amount of charge bailed from the storage well is predetermined in accordance with voltages supplied to a set of bailing electrodes overlying an area on the substrate immediately adjacent the storage well. An individual CCD bailing circuit is associated with each photodetector in the CCD imager of this invention. The advantage is that there is little or no degradation of the signal-to-photon noise ratio using the bailing circuit of this invention because the detector output current is not reduced regardless of the amount of background radiation suppressed. Also, by scanning the bailing frequency, large variation in signals can be accommodated.

In summary, row correlated noise and thermal noise (important at low background radiation levels) is reduced and signal-to-noise ratio (important at high background radiation levels) is increased in the present invention by the combination of the FAT zero metering gate area reduction, the reference column subtraction, and the CCD charge bailer features of this invention. Furthermore, the limitation imposed by CCD transfer noise on the speed of operation of the imager is removed by the substitution of common source follower output circuits in place of the usual horizontal CCD multiplexing register. This latter feature, in addition to increasing the device speed, facilitates the reference row subtraction feature of the invention.

DESCRIPTION OF THE DRAWINGS

The invention is best understood by reference to the accompanying drawings, which:

FIG. 3 includes clocking diagrams corresponding to one integration period $T_I$ of which:

FIG. 3a is a diagram of the time domain waveform of the clock signal $\phi_{TI}$, FIG. 3b is a diagram of the time domain waveform of the clock signal $\phi_{ST}$, FIG. 3c is a diagram of the time domain waveform of the clock signal $V_{B1}$ and, FIG. 3d is a diagram of the time domain waveform of the clock signal $V_{B2}$;

FIG. 4 includes diagrams of clock signals corresponding to one time period $T_{MUX}$ of FIG. 3, of which:

FIG. 4b is a diagram of the time domain waveform of the clock signal $\phi_{FZD}$, FIG. 4c is a diagram of the time domain waveform of the clock signal $\phi_1$, FIG. 4d is a diagram of the time domain waveform of the clock signal $\phi_2$, FIG. 4e is a diagram of the time domain waveform of the clock signal $\phi_3$, FIG. 4f is a diagram of the time domain waveform of the clock signal $\phi_4$, FIG. 4g is a diagram of the time domain waveform of the clock signal $\phi_{TI}$, FIG. 4h is a diagram of the time domain waveform of the clock signal $\phi_{RSO}$ and, FIG. 4i is a diagram of the time domain waveform of the clock signal $\phi_{TO}$;

FIG. 5c is a diagram illustrating the relative magnitude of the semiconductor surface potential corresponding to the schematic diagram of FIG. 5a, FIG. 5c illustrating the low noise operating mode of the circuit of FIG. 5a;

FIG. 6a is a partial schematic diagram illustrating the CCD bucket bailer circuit of the present invention;

FIG. 6b is a diagram illustrating the relative magnitude of the semiconductor surface potential corresponding to the schematic diagram of FIG. 6a;

DETAILED DESCRIPTION OF THE INVENTION

Figure 1:
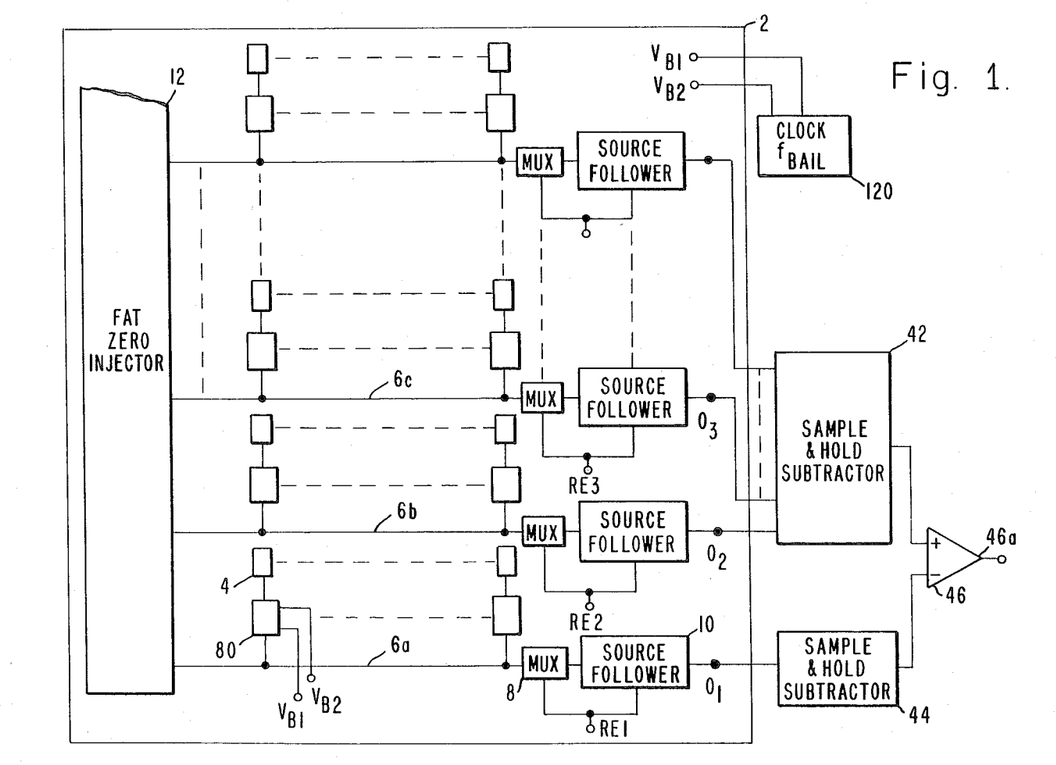
FIG. 1 is a simplified plan view of the present invention.

Referring to FIG. 1, the invention includes a semiconductive substrate (or "chip") 2 of N-type conductivity upon which a CCD imager is formed. The imager includes an array of photodetectors 4 arranged in columns and rows, each column of photodetectors 4 being associated with a CCD column serial register 6. If the CCD imager is a monolithic focal plane array, then each detector may comprise, for example, a P-type collection area formed in the surface of the N-type semiconductive substrate 2.

Each photodetector generates positive charge carriers which are periodically integrated as a single charge packet during an integration period, the integrated packet then being injected into the adjacent CCD column serial register 6. Just as the next integration period begins, the charge packets previously injected into each column register 6 are transferred through the register 6 and into a multiplexer 8. The output signals from the parallel registers 6 are accessed by the multiplexers 8 associated with the parallel registers 6 into a source follower circuit 10 to form a serial train of signals.

In accordance with well-known principles, a FAT zero injector 12 injects a small amount of charge, commonly known as a FAT zero charge packet, into each column CCD register 6, once during each CCD clock cycle. The purpose is to enhance charge transfer efficiency. Ideally, the amount of charge contained in each FAT zero charge packet is constant. Accordingly, the signal charge packets injected from each photodetector 4 into the corresponding column register 6 are simply added to the constant known amount of FAT zero charge.

Noise Sources

Quality of the video signal generated by CCD imagers is generally hampered by several noise sources. One source is interface state noise (or "surface state noise") described in Sequin et al., *Charge Transfer Device*, Academic Press, Inc., New York (1975), pp. 111-112. Simply stated, interface noise arises from a phenomena in which CCD charge packets held in the semiconductor substrate may randomly become trapped in crystalline surface states at the interface between the semiconductor substrate surface and the overlying insulating layer. This causes the amount of transferable charge to fluctuate. Such fluctuations give rise to interface state noise.

Another source of noise is electrical injection noise described in the above-referenced Sequin publication at page 116. Simply stated, electrical injection noise is caused by fluctuations or "jitter" in applied voltages controlling the operation of the charge coupled device. The capacity of an electrical potential "well" in a semiconductor substrate (wherein a charge packet is held) varies with fluctuations in the applied voltage on the overlying gate electrode forming the surface potential well. Such fluctuations create electrical injection noise. Both interface state noise and electrical injection noise are significant when the CCD imager views a scene having a low background radiation level.

In the presence of high background radiation levels, an important noise source is background photon noise, described in Wolfe et al., *The Infrared Handbook*, Office of Naval Research, Department of the Navy, 1978, at pp. 11-18, 11-19, and 11-39 through 11-44. Simply stated, background photon noise arises from fluctuations in the background radiation level and is proportional to the square root of the number $N_0$ of photons or photon generated carriers. The signal, of course, is directly proportional to the number of $N_0$ of photons or carriers, so that the signal-to-photon noise ratio is proportional to the square root of the number $N_0$ of incident photons or photon-generated carriers. The problem is that if the detector gain is reduced in order to compensate for high background radiation levels, the number of photon generated carriers is necessarily reduced, which reduces the signal-to-photon noise ratio.

FAT Zero Injection

Figure 2:
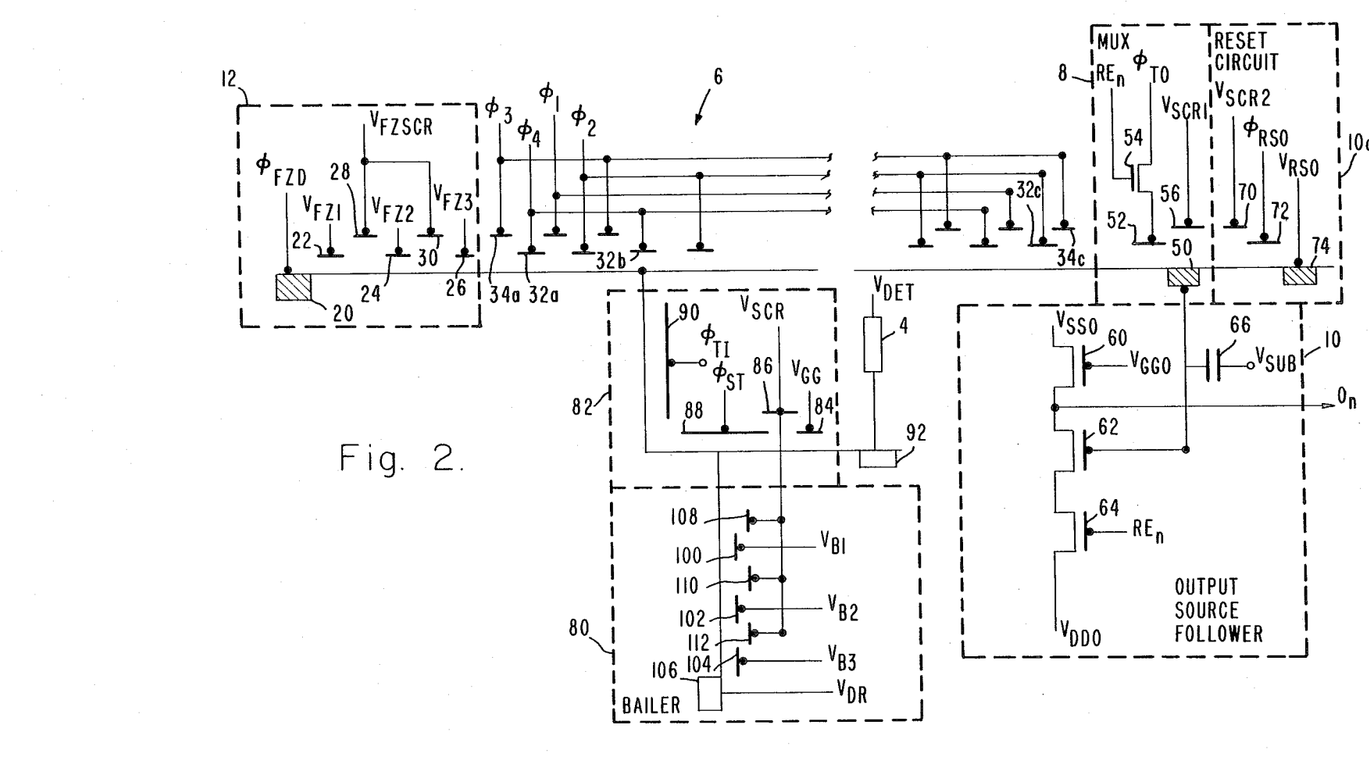
FIG. 2 is a schematic diagram of one CCD column register corresponding to FIG. 1 typical of all CCD column registers in FIG. 1.

The FAT zero injector 12 of FIG. 1 is illustrated in the schematic diagram of FIG. 2. The FAT zero injector 12 is formed on the semiconductive substrate 2 and includes a P-type input diffusion 20, connected to receive a clock signal $\phi_{FZD}$, an insulated control gate 22 overlying the substrate 2 adjacent the diffusion 20 and connected to receive a control voltage $V_{FZ1}$, another insulated control gate 24 overlying the semiconductive substrate 2 adjacent the control gate 22 and connected to receive a control voltage $V_{FZ2}$, and a narrow insulated FAT zero metering gate 26 adjacent the control gate 24 overlying the substrate 2 and connected to receive a metering voltage $V_{FZ3}$. The gates 22, 24 and 26 are preferably formed in a first layer of polycrystalline silicon on an insulating dielectric layer overlying the semiconductive substrate 2, in accordance with well-known techniques for fabrication of charge coupled devices.

The injector 12 further includes a pair of screen gates 28, 30 overlying the gaps between the gate pairs 22, 24 and 24, 26, respectively, connected to receive a voltage $V_{FZSCR}$. The screen gates 28, 30 are preferably formed in an upper level or second layer of insulated polycrystalline silicon in accordance with well-known techniques of charge coupled device fabrication.

Adjacent the FAT zero injector is the CCD column register 6 (typical of all column registers 6 illustrated in FIG. 1) which comprises a 4-phase, double level polysilicon charge coupled device of the type well-known in the art. The FAT zero gates 22, 24, 26, 28 and 30 and the input diffusion 20 are shared in common by all of the column CCD registers 6a, 6b, 6c, etc., of which FIG. 2 is a typical schematic diagram. The plural parallel column registers 6 are individually separated by parallel channel stops (not shown) formed in the surface of the substrate 2 in the well-known manner.

In the typical column register 6, a plurality of insulated gate electrodes 32 is formed in the lower level polycrystalline silicon layer while another plurality of insulating gate electrodes 34 is formed in the upper level of polycrystalline silicon, each upper level electrode 34 overlying the gap between the corresponding pair of adjacent lower level electrodes 32, as indicated in FIG. 2. These electrodes are connected in a sequential periodic progression to receive clock signals $\phi_1$, $\phi_2$, $\phi_3$, $\phi_4$, as illustrated in FIG. 2, in accordance with well-known 4-phase CCD clocking principles.

Normal FET Zero Injection

Figure 4:
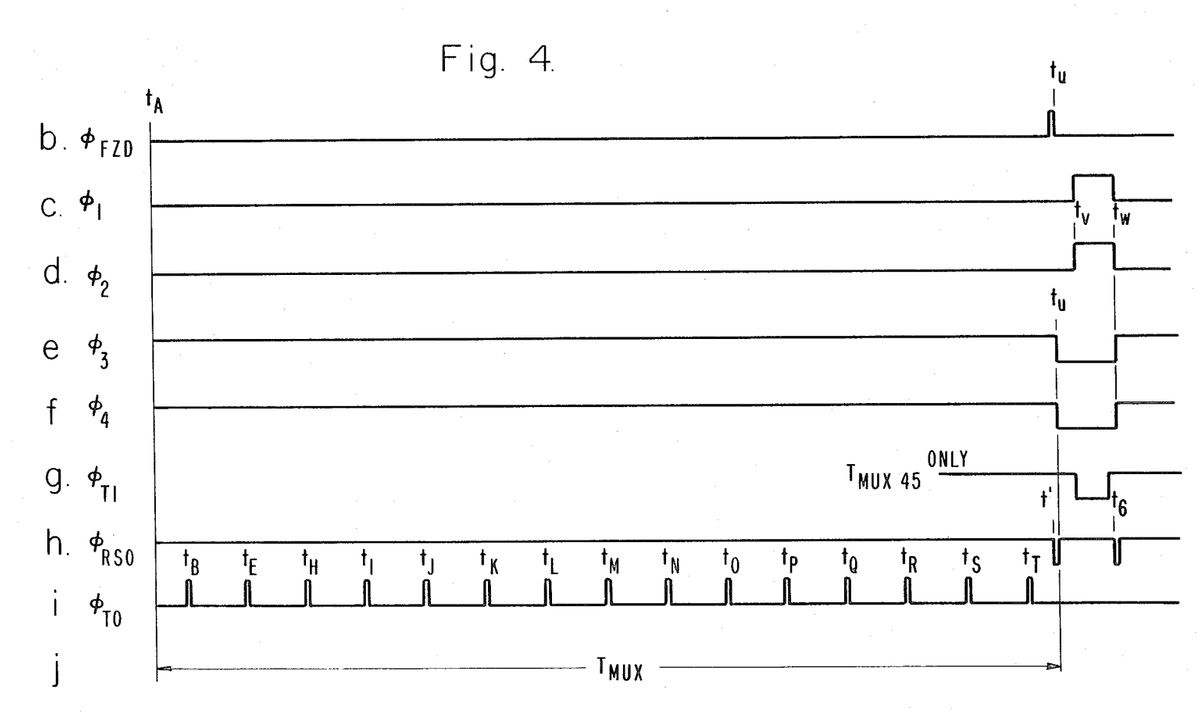
Figure 5A:
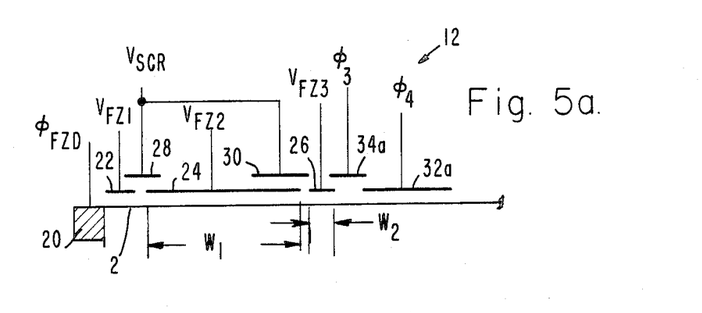
FIG. 5a is a partial schematic diagram illustrating the low noise CCD FAT zero injector circuit of this invention, including the FAT zero metering gate of reduced area.

The clock signals $\phi_{FZD}$, $\phi_1$, $\phi_2$, $\phi_3$, and $\phi_4$ are illustrated in FIGS. 4b, c, d, e, and f, respectively, and will be discussed in detail later in this specification. Basically, during each CCD clock cycle established by the clock signals $\phi_1$, $\phi_2$, $\phi_3$, $\phi_4$, the clock signal $\phi_{FZD}$ causes the FAT zero injector 12 to inject a single FAT zero charge packet into the CCD column register 6. The size of the FAT zero charge packet is determined by the voltages $V_{FZ1}$, $V_{FZ2}$, and $V_{FZ3}$, normally $V_{FZ1} > V_{FZ2}$ and $V_{FZ2} = V_{FZ3}$. This operation is best understood by reference to FIGS. 5a and 5b. FIG. 5a corresponds to that portion of FIG. 2 illustrating the FAT zero injector 12.

Figure 5B:
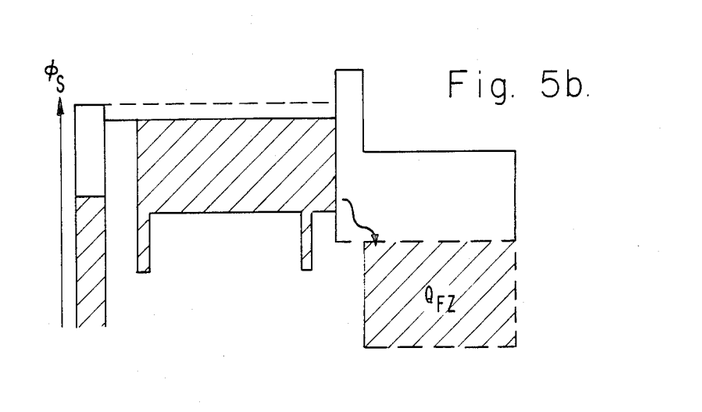
FIG. 5b is a diagram illustrating the relative magnitude of the semiconductor surface potential corresponding to the schematic diagram of FIG. 5a, FIG. 5b corresponding to a high noise or set up mode of operation.

Operation of the FAT zero injector 12 begins when the clock signal $\phi_{FZD}$ is temporarily pulsed positively, raising the surface potential of the diffusion 20 to the dashed-line level illustrated in FIG. 5b. This causes positive charge or "holes" to be injected from the diffusion 20, beneath the control gate 22 and into the surface potential well beneath the gate 24 illustrated in solid-line in FIG. 5b. Thereafter, the clock signal $\phi_{FZD}$ returns to its ambient level so that the surface potential in the diffusion 20 returns to the solid-line level illustrated in FIG. 5b.

By the well-known process of charge equilibration, the charge $Q_{FZ}$ stored beneath the control gate 24 fills the surface potential well beneath the gate 24 to the top defined by the surface potential barrier beneath the gate, 22 any excess charge being withdrawn into the input diffusion 20. Therafter, the clock signals $\phi_3$ and $\phi_4$ applied to the CCD gates 34a, 32a, respectively, are pulsed downwardly in potential, thus causing the surface potential beneath them to assume the dashed-line configuration illustrated in FIG. 5b. As a result, the charge packet $Q_{FZ}$ is transferred as a FAT zero charge packet beneath the gate 34a to be stored in the surface potential well formed beneath the gate 32a. The FAT zero charge packet is then transferred through the CCD column serial register 6 in accordance with well-known principles of CCD charge transfer.

The amount of charge $Q_{FZ}$ contained in the FAT zero packet is determined by the difference in the voltages $V_{FZ1}$ and $V_{FZ2}$, which fluctuates due to the presence of electrical injection noise on the gates 22 and 24. Such fluctuations cause the FAT zero charge to fluctuate synchronously in all CCD serial column registers 6 in the array of FIG. 1. These fluctuations cause row correlated noise because the gates 22 and 24 are shared in common among all of the CCD serial registers 6, as is the input diffusion 20.

The amount of charge contained in the FAT zero charge packet $Q_{FZ}$ also varies due to interface state noise beneath the gates 24 and 26. Such interface state noise is uncorrelated but does cause the amount of charge in the FAT zero charge packet $Q_{FZ}$ to fluctuate. All fluctuations, both interface state noise and electrical injection noise, induce noise into the video output signal generated by the CCD imager of FIG. 1.

Low Noise FAT Zero Injection

Figure 5C:
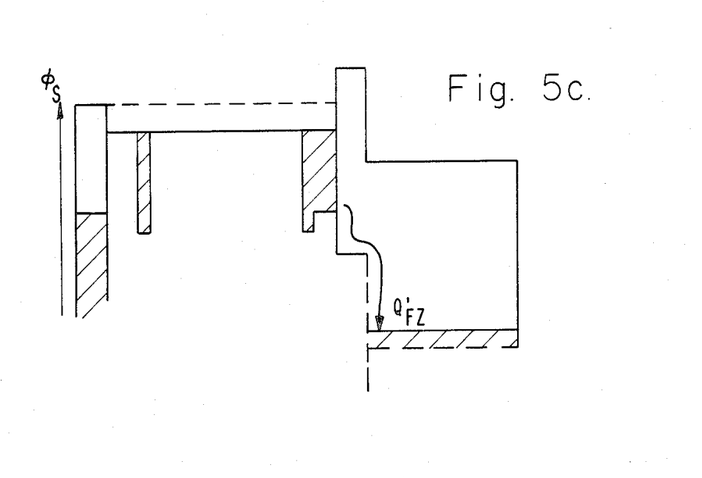

In the present invention, the effects of electrical injection noise and interface state noise are suppressed by the use of the FAT zero metering gate 26 of reduced area. The device illustrated in FIG. 5a may be operated in the low noise mode illustrated in FIG. 5c, in which the FAT zero charge packet $Q'_{FZ}$ illustrated in FIG. 5c is stored in the narrow surface potential well beneath the equally narrow FAT zero metering gate 26. In this low noise mode, the voltages $V_{FZ1}$ and $V_{FZ2}$ are set to be equal to one another so that the gates 22 and 24 perform the same charge equilibration function, while the voltage $V_{FZ3}$ is set to be more negative than the latter.

Figure 8:
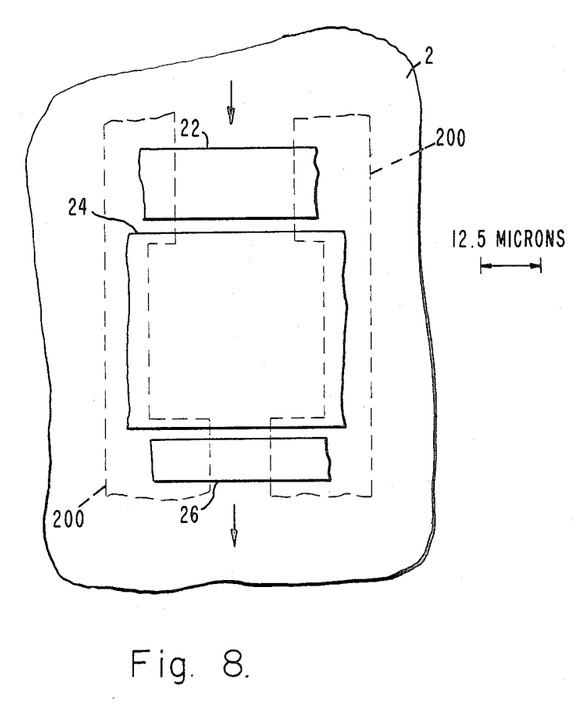
FIG. 8 has a plan view corresponding to a portion of the schematic diagram of FIG. 2.

The width W1 of the control gate 24 is on the order of 45 microns while the width W2 of the metering gate 26 is on the order of only 6 microns. FIG. 8 illustrates in plan view another (preferred) technique of using a channel stop 200 to reduce the effective area of the control gate 26 by a factor of ten by constructing the width of the charge flow channel 202 beneath the gate 24. This relative reduction in area of the metering gate 26 reduces the fluctuation in the amount of charge $Q'_{FZ}$ of the FAT zero charge packet stored beneath the metering gate 26 caused by electrical injection noise in the voltages $V_{FZ2}$ and $V_{FZ3}$ or surface state noise at the semiconductor-dielectric interface beneath the gate 26. The effect of interface state noise on the amount of charge stored beneath the metering gate 26 is reduced because reduction in the area of the metering gate 26 reduces the ratio of the number of interface states beneath the metering gate 26 to the number of carriers in the FAT zero charge packet $Q'_{FZ}$. The effect of electrical injection noise on the amount of charge stored beneath the metering gate 26 is reduced because the charge storing capacity of the surface potential well beneath the metering gate 26, illustrated in FIG. 5c, changes proportionately less with fluctuations in the applied voltages on the metering gate 26.

In summary, both row correlated noise and uncorrelated interface state noise effects are reduced in proportion to the reduction of the area of the metering gate 26.

Reference Column Subtraction

Row correlated noise is further reduced by the use of reference column subtraction, illustrated in FIG. 1. The serial succession of charge packets in each column register 6 generates output signals in each source follower 10, which are multiplexed on a column-by-column basis by each multiplexer 8 operating the synchronous succession with one another. The output from each source follower 10 is connected to the input of a sample-and-hold subtractor 42, with the exception of the first or left-most column register 6a in FIG. 1, its source follower being connected instead to a separate sample-and-hold subtractor 44. The outputs from the sample-and-hold subtractors 42, 44 are connected to the positive and negative inputs of a differential amplifier 46, respectively. The reference sample-and-hold subtractor 44 samples and holds each output signal from the reference column register 6a, while the sample-and-hold subtractor 42 samples and holds, in turn, each output signal from the remaining CCD column registers 6b, 6c, etc., as it is multiplexed by the corresponding multiplexer 8. Thus, each output signal from each of the remaining CCD column registers 6b, 6c, etc., is subtracted in turn from the output signal of the reference CCD column 6a at the differential amplifier 46.

The column of photodetectors 4 associated with the reference CCD column register 6a are prevented from injecting charge, in a manner to be described later in this specification. Thus, the reference CCD column register 6a contains only the FAT zero charge packets with associated row correlated noise and uncorrelated interface state noise. Because the row correlated noise is the same from column to column, the subtraction performed by the differential amplifier 46 common mode rejects the row correlated noise, producing a video signal at the differential amplifier output 46a in which row correlated noise is suppressed in proportion to the common mode rejection ratio achieved by the subtraction performed by the differential amplifier 46.

CCD Column Registers

The schematic diagram of FIG. 2 is typical of all the CCD column registers 6a, 6b, 6c, etc., illustrated in FIG. 1, each component therein also being typical. In one exemplary embodiment, there may be a total of 15 column registers 6 each associated with its own adjacent column of 45 photodetectors 4, all of which are as shown in the schematic diagram of FIG. 2, including all associated circuitry such as the multiplexer 8 and the output source follower 10.

Output Source Follower and Multiplexer

The CCD column register 6, comprising the double level polycrystalline silicon gates 32, 34 terminates at the multiplexer 8. The multiplexer 8 includes an output diffusion 50, a multiplexing gate 52, a multiplexing transistor 54, comprising a P-channel field effect transistor, and a screen gate 56. As understood in this specification, the term "P-channel field effect transistor" refers to a P-type conductivity source and drain formed in the substrate 2 and an insulated polycrystalline silicon gate electrode overlying the transistor's source-to-drain channel. The source of the transistor 54 is connected to receive a clock signal $\phi_{TO}$ while its drain is connected to the CCD gate 52. The gate of the transistor 54 is connected to receive a clock signal $\phi_{REn}$, where the index n corresponds to the number of the particular column in which the register 6 is located. The clock signal $RE_n$ initiates the transfer of each charge packet from beneath the last electrodes 32c, 34c of the column CCD register 6, underneath the multiplexing gate 52 and the screen gate 56 and into the output diffusion 50.

The source follower circuit 10 senses the magnitude of the charge packet received in the output diffusion 50. It comprises a source transistor 60, a source follower transistor 62, a drain transistor 64 and a storage capacitor 66. Each of the transistors 60, 62, 64 comprise P-channel field effect transistors. The source of the transistor 60 is connected to a voltage supply $V_{SS0}$, its gate being connected to a voltage supply $V_{GG0}$ and its drain connected to the source of the source follower transistor 62 and to the output node $O_n$. The gate of the source follower transistor 62 is connected to the output diffusion 50 while its drain is connected to the source of the transistor 64. The gate of the transistor 64 is connected to receive the clock signal $RE_n$ while its drain is connected to the voltage supply $V_{DD0}$. One electrode of the capacitor 66 is connected to the gate of the source follower transistor 62 while its other electrode is connected to the substrate voltage $V_{SUB}$.

The capacitor 66 functions to supplement the charge storing capacity of the source follower transistor gate. Each charge packet entering the output diffusion 50 under control of the multiplexer 8 is stored on the capacitor 66 and increases the voltage on the gate of the source follower transistor 62, thus raising the voltage on the output node $O_n$. The advantage of the source follower circuit 10 is that it facilitates the reference column subtraction function illustrated in FIG. 1 and eliminates the clock speed limitations previously imposed by the use of a prior art horizontal CCD multiplexing register, which the source follower circuits 10 replace.

A source follower reset circuit 10a resets the charge and voltage of the output diffusion 50 and includes a screen gate 70, a CCD gate 72 and a drain diffusion 74. The screen gate 70 is connected to receive the voltage $V_{SCR2}$, the CCD gate 72 is connected to receive the clock signal $\phi_{RSO}$, while the drain diffusion 74 is connected to receive the voltage $V_{RSO}$. The clock signal $\phi_{RSO}$ is operated in synchronism with the CCD clock signals $\phi_1$, $\phi_2$, $\phi_3$, $\phi_4$ to reset the output diffusion 50 once every CCD clock cycle.

Photodetectors

FIG. 2 illustrates only one photodetector 4 associated with the column register 6, it being understood that there is a column of many photodetectors as illustrated in FIG. 1. Referring to FIG. 2, photogenerated carriers from the photodetector 4 are injected into the CCD register 6 beneath CCD gate 32b through a CCD channel 82 comprising a diffusion 92, a control gate 84, a screen gate 86, an integration gate 88 and a transfer gate 90. The photodetector 4 is connected to a common bias voltage supply $V_{DET}$. The control gate 84 is connected to a voltage supply $V_{GG}$, the screen gate 86 is connected to a voltage supply $V_{SCR}$, the integration gate 88 is connected to receive a clock signal $\phi_{ST}$ and the transfer gate 90 is connected to receive the clock signal $\phi_{TI}$. The transfer gate 90 prtially overlies the integration gate 88 and the CCD gate 32b as illustrated in the simplified diagram of FIG. 6a.

Photocarriers generated by the photodetector 4 flow beneath the gates 84 and 86 and are accumulated or "integrated" beneath the integration gate 88 in a surface potential well formed in the substrate 2 during an integration period $T_I$. At the end of the integration period, clock signal $\phi_{TI}$ is pulsed negatively while the clock signal $\phi_{ST}$ is pulsed positively. This ejects the integrated charge from beneath the gate 88 and under the transfer gate 90 into the CCD column register 6 beneath the CCD gate 32b. This operation is illustrated in FIGS. 3a and 3b, showing the periodic movement of the clock signals $\phi_{TI}$ and $\phi_{ST}$ at the end of each integration period $T_I$. The amount of charge contained in each charge packet is a measure of the video signal amplitude generated by the photodetector 4.

A significant problem, previously mentioned, is that, in the presence of high background radiation levels, the amount of photocarriers generated by the photodetector 4 may far exceed the charge storage capacity of the surface potential well formed beneath the control gate 88 or of the surface potential wells formed in the column CCD register 6 beneath the various CCD gates 32, 34. If this capacity is so exceeded, the video signal may be distorted or completely lost. Prior art attempts to avoid this problem by reducing the gain of the photodector 4 created another problem by reducing the signal-to-photon noise ratio, as previously described.

Bucket Bailer

This problem is solved by the novel CCD charge bailer 80 shown in FIG. 2 comprising control gates 100, 102, 104, drain diffusion 106 and screen gates 108, 110 and 112. An individual bucket bailer 80 is associated with each one of the plurality of photodetectors 4 in the array of FIG. 1. The screen gates 108, 110, 112 are connected to the screen gate voltage supply $V_{SCR}$. The control gate 100 is connected to receive the clock signal $V_{B1}$, the control gate 102 is connected to receive the clock signal $V_{B2}$, the control gate 104 is connected to a DC voltage supply $V_{B3}$ while the drain diffusion 106 is connected to a drain voltage supply $V_{DR}$.

Figure 6:
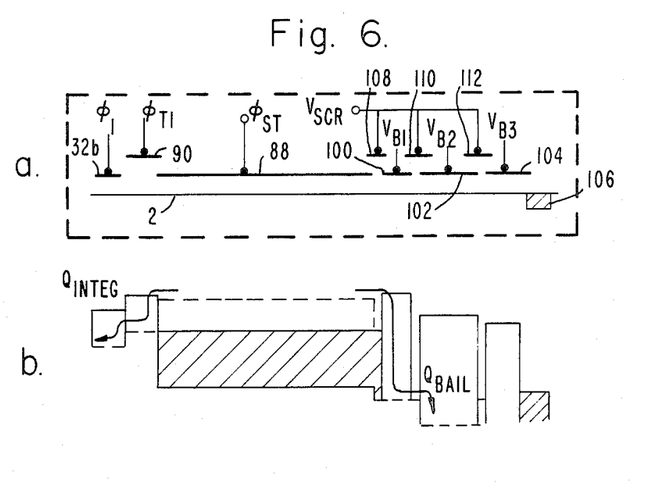

FIG. 6a is an enlarged schematic diagram of the bucket bailer 80 corresponding to FIG. 2 and FIG. 6b is a diagram illustrating the electrical substrate surface potential corresponding to the schematic diagram of FIG. 6a. During each integration period $T_I$, the clock signals $\phi_{TI}$, $V_{B1}$ and $V_{B2}$ are relatively high in voltage while the clock signal $\phi_{ST}$ is relatively low in voltage, so that the surface potential assumes the solid-line configuration illustrated in FIG. 6b. The surface potential well beneath the gate 88 is progressively filled by photocarriers generated in the photodetector 4.

In order to avoid overfilling the surface potential well beneath the integration gate 88, the clock signals $V_{B1}$ and $V_{B2}$ are periodically pulsed negatively so that the surface potential beneath the control gates 100, 102 drops to the dashed-line level illustrated in FIG. 6b, forming a surface potential well therebeneath. Thereafter, the clock signals $V_{B1}$ and $V_{B2}$ return to their original positive levels, causing the surface potential beneath the gates 100, 102 to return to the solid-line configuration illustrated in FIG. 6b. This causes a fractional amount, $Q_{BAIL}$, of the charge held beneath the integration gate 88 to be diverted beneath the gate 102. This charge is dumped over the surface potential barrier beneath the gate 104 into the drain diffusion 106. The charge $Q_{BAIL}$, is the charge "bailed" from beneath the gate 88.

This operation is best understood by reference to the clock diagrams of FIGS. 3c and 3d, illustrating that the bailing operation takes place a number of times during the integration period $T_I$, depending upon the background radiation level. The frequency $f_{BAIL}$ of the bail clock signals $V_{B1}$ and $V_{B2}$ may be increased to accommodate an increased background radiation level. It is contemplated that an intelligent device 120 (FIG. 1) may be used to control the frequency $f_{BAIL}$ of the clock signals $V_{B1}$ and $V_{B2}$ in response to variations in the background radiation level. The bailed charge $Q_{BAIL}$ is a constant which is determined by the difference in magnitude of the clock signals $V_{B1}$ and $V_{B2}$. The charge $Q_{TOTAL}$ generated by the photodetector 4 during the integration period $T_I$ is equal to the charge $Q_{CCD}$ dumped from beneath the integration gate 88 into the CCD column register 6 at the end of the integration period $T_I$ plus the product of the bailed charge $Q_{BAIL}$, the integration period $T_I$ and the bail frequency $f_{BAIL}$. This may be expressed as:

$$Q_{TOTAL} = Q_{CCD} + Q_{BAIL} \times T_I \times f_{BAIL}.$$

A significant advantage of the CCD bailer 80 is that the bail frequency $f_{BAIL}$ may be adjusted to accommodate any background radiation level without degrading the signal-to-photon noise ratio because the photogenerated current from the detector 4 is not diminished in this invention. Accordingly, the CCD imager of this invention is useful for viewing very dim signals in the presence of very low background radiation, such as that encountered in deep space, and also for viewing images in the presence of very bright background radiation, such as that encountered in bright daylight on the ground. It is believed that this is the first such CCD imager having such wide versatility.

Figure 7:
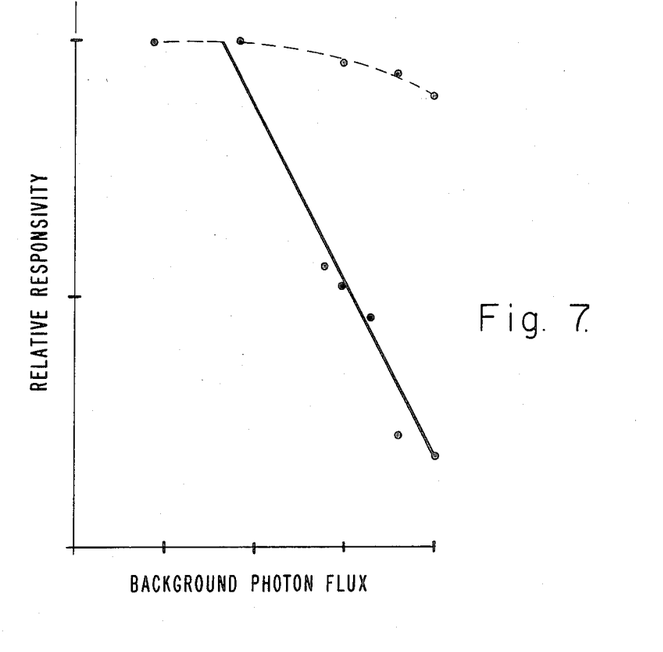
FIG. 7 is a graph illustrating the relative responsivity of the imager of this invention compared to one of the prior art, on the ordinant, and the corresponding background photon intensity on the abscissa.

FIG. 7 is a graph illustrating the performance of the charge bailer of this invention (dashed-line) compared with the performance of prior art imagers (solid-line). The ordinant of the graph of FIG. 7 corresponds to the relative imager responsivity plotted logarithmically while the abscissa of the graph of FIG. 7 corresponds to the background radiation level, also plotted logarithmically. Note how fast the responsivity of the prior art imager falls off with increase in background radiation level (solid-line) while the relative responsivity of the CCD imager of this invention using CCD charge bailing hardly falls off at all (dashed-line).

Detailed Description of Reference Column Subtraction

In order to implement the reference column subtraction feature described previously, the first column register 6a is used to provide the reference signal which is subtracted from the output signals from the other column registers 6b, 6c, etc. The output voltage from the sample-and-hold subtractor 44 (associated with the reference column register 6a) is applied to the negative input of the differential amplifier 46. The output voltage from the sample-and-hold subtractor 42 is applied to the positive input of the differential amplifier 46. For this purpose, the transfer gates 90 associated with the first or left-most reference CCD column register 6a (only) of FIG. 1 are not connected to receive the clock signal $\phi_{TI}$, contrary to the schematic diagram of FIG. 2, but are instead connected to a sufficiently high voltage source to block charge flow beneath the transfer gate 90. The transfer gates associated with the remaining column registers 6b, 6c, etc., of FIG. 1 are each connected as illustrated in FIG. 2 to permit charge to flow from the corresponding photodetectors. The reference signal derived from the reference column register 6a is applied to the negative input of the differential amplifier 46 and represents FAT zero charge and noise only. The reference signal is subtracted from the output signals of the other column registers 6b, 6c, etc., in the differential amplifier 46 to eliminate any row correlated noise in the manner previously described in this specification.

Timing

Figure 3:
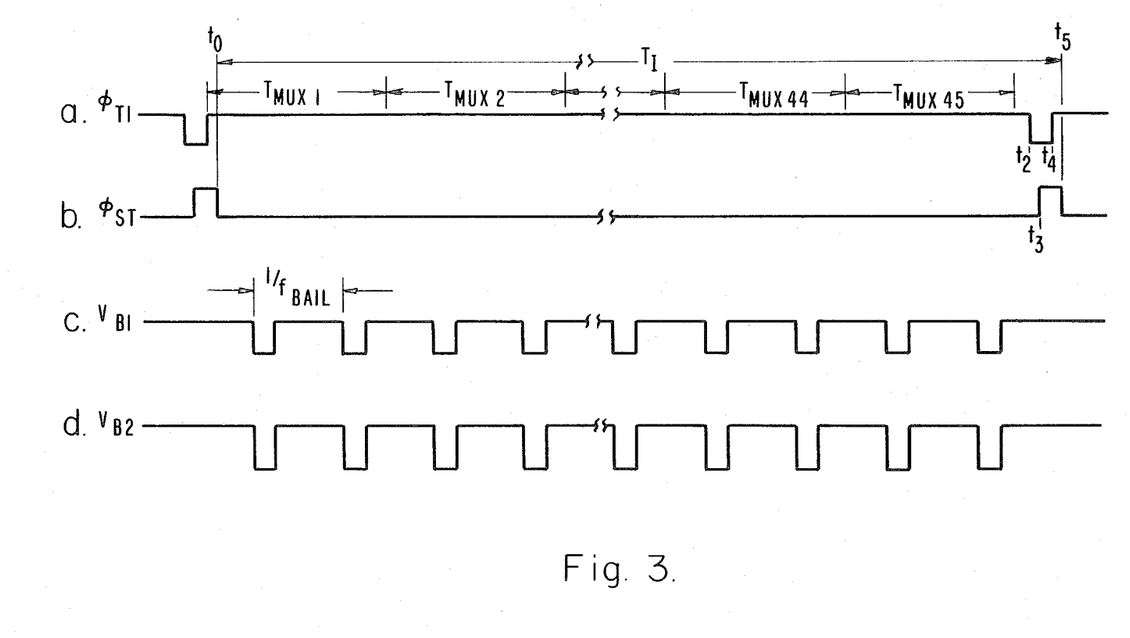
Figure 4A:
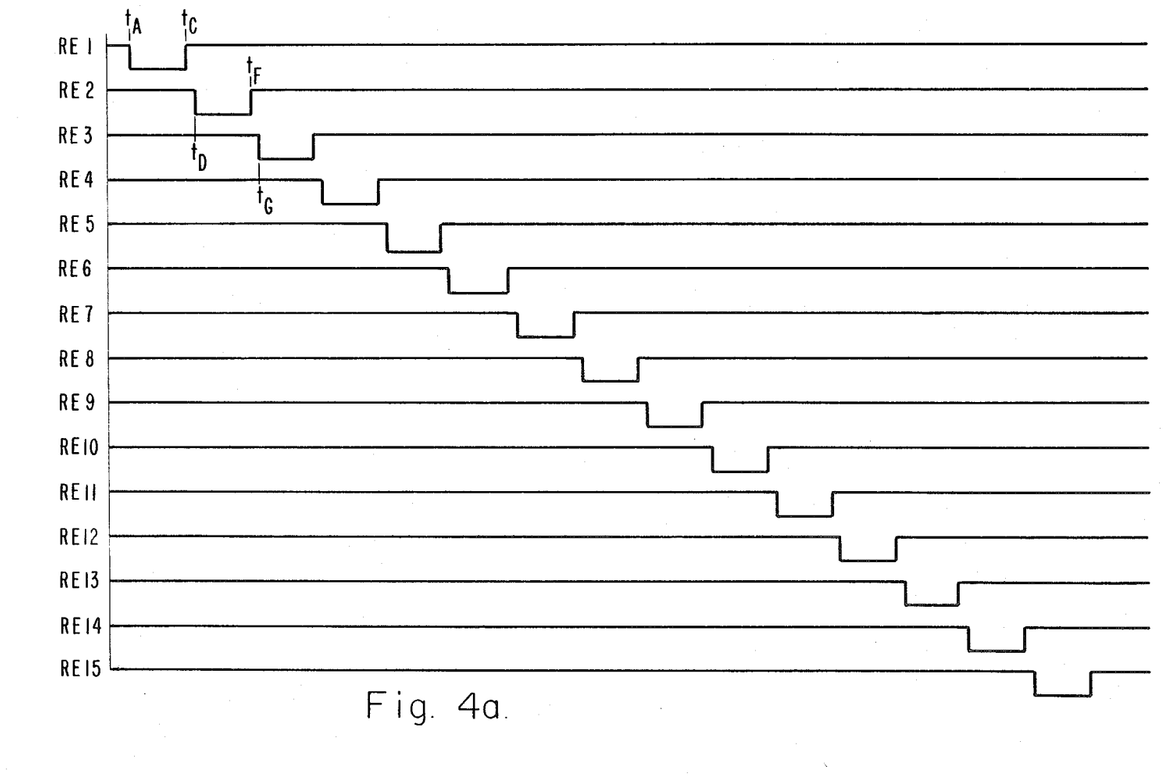
FIG. 4a is a diagram of the time domain waveform of the 15 clock signals beginning with RE1, RE2 and continuing up to RE15.

Operation of the CCD imager of FIGS. 1 and 2 will now be described by simultaneous reference to the clock diagrams of FIGS. 3 and 4. FIG. 4 includes diagrams of the time domain waveform of the clock signals RE1 through RE15 (FIG. 4a), $\phi_{FZD}$ (FIG. 4b), $\phi_1$ through $\phi_4$ (FIGS. 4c through 4f), $\phi_{TI}$ (FIG. 4g), $\phi_{RSO}$ (FIG. 4h), and $\phi_{TO}$ (FIG. 4i). FIG. 3 illustrates the overall operation during the integration period $T_I$. FIG. 4 illustrates the detailed operation during the multiplexing period $T_{MUX}$ which is repeated many times over the integration period $T_I$ of FIG. 3. FIG. 4 has a scale much larger than that of FIG. 3.

Integration Period $T_I$

The integration $T_I$ period begins at time $t_0$ of FIG. 3 when the clock signals $\phi_{TI}$, $V_{B1}$ and $V_{B2}$ are held at a positive voltage while the clock signal $\phi_{ST}$ is held at a lesser voltage to create a surface potential well beneath the integration electrode 88 illustrated in solid line in FIG. 6b. Immediately, photo-generated carriers from the photodetector 4 flow beneath and are accumulated under the electrode 88. This occurs simultaneously in the case of all of the photodetectors 4 in the CCD imager of FIG. 1.

During the integration period $T_I$ of FIG. 3, all of the charge packets injected during the previous integration period into each CCD column register 6a, b, c, etc., are simultaneously transferred downwardly in serial fashion toward the respective source follower circuits 10. If, for example, there are forty-five photodetectors in each column of photodetectors associated with each column CCD register 6, then forty-five charge packets will be transferred downwardly in serial succession in each CCD column register 6. If the CCD imager of FIG. 1 comprises, for example, fifteen column registers 6 associated with fifteen columns of photodetectors 4, then, during each multiplexing period $T_{MUX}$, each charge packet will be transferred downwardly in its column register 6 by one CCD unit cell, a distance corresponding to the spacing between adjacent photodetectors. Each source follower circuit 10 immediately senses a new charge packet and then each of the fifteen source follower circuits 10 associated with each of the fifteen column registers 6 is successively multiplexed (or sampled) one at a time. This process is repeated forty-five times (during forty-five successive multiplexing periods $T_{MUX}$) until all the previously injected charge packets have been multiplexed through the source followers 10.

Multiplexing Period $T_{MUX}$

Operation of the CCD imager of FIG. 1 during the many multiplexing periods $T_{MUX}$ of FIG. 3 will now be described. In this description, individual operation of each of the column CCD registers 6a, 6b, 6c, etc., of FIG. 1 will be described in terms of the typical schematic diagram of FIG. 2.

The first multiplexing period $T_{MUX}(1)$ begins at time $t_A$. At time $t_A$ of FIG. 4, the clock signal RE1 is pulsed negatively, which activates the multiplexer 8 and source follower 10 of the first column register 6a of the CCD imager of FIG. 1. At time $t_A$, clock signal RE1 turns the multiplexing transistor 54 of column register 6a "on", thus applying the relatively low voltage clock sigal $\phi_{TO}$ to the multiplexing electrode 52 of the column register 6a. This creates an attractive surface potential well beneath the multiplexing gate 52, causing a charge packet previously stored beneath the CCD gate 32c of the column register 6a to be transferred and stored beneath the multiplexing gate 52.

Thereafter, at time $t_B$, the clock signal $\phi_{TO}$ is pulsed positively, causing the charge packet stored beneath the multiplexing gate 52 to be transferred into the output diffusion 50 of the column register 6a. The charge packet is stored in the combined capacitance of the diffusion 50, the capacitor 66 and the gate of the source follower transistor 62. The charge packet stored on the capacitor 66 increases the gate voltage of the source follower transistor 62, thus decreasing its source-to-drain current and raising the voltage on the output node $O_1$ of the column register 6a. This increase in voltage is proportional to the size of the charge packet transferred beneath the multiplexing electrode 52 at time $t_B$.

The voltage on the output node $O_1$ is immediately subtracted in a sample-and-hold subtractor 44 from the voltage previously present on that output node to generate an output voltage $V_{OUTPUT}(1)$ representative of the absolute size of the charge packet sensed in the output diffusion 50 at time $t_B$. The output voltage $V_{OUTPUT}(1)$ is applied by the sample-and-hold subtractor 44 to the negative input of the differential amplifier 46. The sample-and-hold subtractor 44 applies this output voltage throughout the remainder of the multiplexing period $T_{MUX}$. At time $t_C$, the clock signal RE1 is turned "off", or returned to its higher ambient level.

At time $t_D$, the clock signal RE2 is pulsed negatively, which activates the multiplexer 8 and source follower 10 associated with the second CCD column register 6b. The same operation as described in connection with the first column register 6a then takes place in the second column register 6b of FIG. 1. At time $t_E$, the clock signal $\phi_{TO}$ is again pulsed positively, and a voltage is generated at the output node $O_2$ of the second column register 6b, representative of the signal charge packet sensed at the source follower 10 of the column register 6b. This voltage is subtracted in the sample-and-hold subtractor 42 from the voltage previously present on the output node $O_2$ to generate an output voltage $V_{OUTPUT}(2)$ representative of the sensed signal charge packet at the output node $O_2$. This output voltage is applied to the positive input of the differential amplifier 46. The differential amplifier 46, in turn, generates an output voltage $V_{OUTPUT}(2)-V_{OUTPUT}(1)$.

At time $t_F$, the clock signal RE2 is turned "off" and the clock signal RE3 is turned "on" at time $t_G$. This causes the same process as was previously described in connection with the second column register 6b to be repeated in the third column register 6c. This process is repeated until the outputs from all fifteen column registers 6 of the CCD array of FIG. 1 have been sampled and subtracted in succession at times $t_I$, $t_J$, $t_K$, $t_L$, $t_M$, $t_N$, $t_O$, $t_P$, $t_Q$, $t_R$, $t_T$, and $t_S$ of FIG. 4.

The remaining 44 charge packets stored in each of the fifteen column registers 6 are then transferred down by one more CCD unit cell in accordance with the following description of operation. In this description, the alternate pairs of those adjacent CCD gates 32, 34 which are connected (in FIG. 2) to receive the clock signals $\phi_1$, $\phi_2$, respectively, are called the "$\phi_1$, $\phi_2$ gates". Also, the remaining pairs of those adjacent CCD gates 32, 34 which are connected to receive the clock signals $\phi_3$, $\phi_4$, respectively, are called the "$\phi_3$, $\phi_4$ gates".

Initially, from time $t_A$ to time $t_u$, all charge packets are stored beneath the $\phi_1$, $\phi_2$ gates (because the clock signals $\phi_1$, $\phi_2$ are of lower potential than $\phi_3$, $\phi_4$). Charge transfer begins at time $t_u$ when the clock signals $\phi_3$ and $\phi_4$ are pulsed negatively, creating a surface potential well under the $\phi_3$, $\phi_4$ gates. Thereafter, at time $t_V$, the clock signals $\phi_1$ and $\phi_2$ are pulsed positively, thus transferring charge packets out from under the $\phi_1$, $\phi_2$ gates to be held beneth the $\phi_3$, $\phi_4$ gates. At time $t_W$, the clock signals $\phi_1$, $\phi_2$ are pulsed negatively while the clock signals $\phi_3$, $\phi_4$ are pulsed positively, causing all the charge packets to be transferred out from under the $\phi_3$, $\phi_4$ gates and to be stored beneath the next succeeding $\phi_1$, $\phi_2$ gates. In this manner, all charge packets in the 15 column registers 6 are simultaneously moved downward toward the source follower 10 by a distance corresponding to one CCD unit cell. This concludes the first multiplexing period $T_{MUX}(1)$.

A new charge packet is now stored beneath each of the output gates 32c of the fifteen column registers 6 in preparation for the next multiplexing cycle time $T_{MUX}(2)$. The multiplexing process previously described in connection with the multiplexing time $T_{MUX}(1)$ is repeated during successive multiplexing periods $T_{MUX}(2)$ through $T_{MUX}(45)$ so that all the charge packets output from the forty-five detectors associated with each of the fifteen column registers 6 are multiplexed through the corresponding source followers 10 in each of the fifteen column registers 6.

Conclusion of the Integration Period $T_I$

At time $t_2$ of FIG. 3, after the conclusion of the last multiplexing period $T_{MUX}(45)$, the clock signal $\phi_{TI}$ is pulsed negatively which permits charge flow beneath the transfer gate 90. This occurs only at the end of the multiplexing time period $T_{MUX}(45)$ but not at any of the other multiplexing time periods $T_{MUX}(1)$ through $T_{MUX}(44)$. At time $t_3$ of FIG. 3, the clock signal $\phi_{ST}$ is pulsed positively, causing the photo-generated charge packets accumulated beneath the integration gates 88 throughout the array of FIG. 1 to be injected under the respective transfer gates 90 into the CCD column registers 6, in the manner previously described in connection with FIG. 2. This concludes the integration period $T_I$ for all detectors 4 in the CCD imager of FIG. 1. At time $t_4$, the clock signal $\phi_{TI}$ is turned "off" and at time $t_5$, the clock signal $\phi_{ST}$ is turned "off", thus beginning the next integration period $T_I$ for all photodetectors 4 throughout the imager of FIG. 1. At time $t_6$, the clock signal $\phi_{RSO}$ is pulsed negatively, which activates the source follower reset circuit 10a. Specifically, the output diffusion 50 is reset to the voltage $V_R$ of the drain diffusion 74 at time $t_6$ by virtue of the negative voltage applied at this time by the clock signal $\phi RSO$ to the gate 72, rendering the channel between the output diffusion 50 and the drain diffusion 74 conductive. Thus, the output node comprising the output diffusion 50, the capacitor 10 and the gate of the source follower transistor 62 is reset in preparation for receipt of the next charge packet in the diffusion 50. In order to ensure a complete resetting by the reset circuit 10a, this process may be performed not only at time $t_6$ but also at time $t'$ of FIG. 4h.

From FIGS. 3c and 3d it is apparent that during the entire integration period $T_I$, the bucket bailer 80 operates periodically to bail a set amount of charge $Q_{BAIL}$ out of the surface potential well beneath the integration gate 88. As previously described, the frequency $f_{BAIL}$ at which the CCD bailer 80 is operated is preferably adjusted to precisely compensate for excessive background radiation flux so as to avoid overfilling the surface potential well beneath the integrating gate 88. This adjustment may be performed by an intelligent device 120, which responds to changes in background radiation level, illustrated in FIG. 1.

The period $T_{RE}$ of each of the clock signals RE1 through RE15 must be at least on the order of 16 microseconds, corresponding to the maximum slew rate noise limit of each of the source follower circuits 10. The duration of the multiplexing time period $T_{MUX}$ must be at least as great as the product of the time period $T_{RE}$ multiplied by the number of column registers 6 in the CCD imager plus 2 additional intervals $T_{RE}$ to allow for multiplexing delays. Thus, for fifteen columns, $T_{MUX}$ equals 16 microseconds times 17 or about 272 microseconds. The integration time period $T_I$ is about equal to the multiplexing time period $T_{MUX}$ multiplied by the number of detectors per column. Thus, $T_I$ equals 272 microseconds times 45 or about 12 milliseconds. The number of detectors per column and the number of columns per array thus determines the duration of the time periods $T_{MUX}$ and $T_I$ and may be chosen by the user to conform to the specifications of the system in which the invention is to be used.

Variations of the above-described embodiments of the invention may be made without departing from the spirit and scope of the invention.

What is claimed is:

1. A low noise charge transfer device imager formed on a semiconductive substrate, comprising:
    a plurality of semiconductive photodetectors organized by columns;
    a plurality of column charge transfer device registers disposed to receive charge from each corresponding column of photodetectors, said charge transfer device registers including pluralities of charge transfer device gates connected to receive clock signals;
    means for integrating charge from each photodetector during an integration period and therefater injecting the integrated charge into an adjacent portion of the corresponding one of said column charge transfer device registers as a charge packet;
    means for multiplexing the output signals from each of said charge transfer device registers;
    a reference column charge transfer device register;
    means for subtracting the output from each of said charge transfer device column registers from that of said reference column charge device registers;
    means for periodically bailing a certain amount of charge from said integrating means by a selected number of times during said integration; and
    a FAT zero charge injector including a FAT zero metering gate overlying said substrate at the input to each of said column charge transfer device registers including means for applying an electrical potential to said metering gate to form a surface potential well therebeneath in said substrate registered to said metering gate, the effective area of said metering gate being reduced to a small amount relative to the effective area of said charge transfer device gates.

2. The device of claim 1 wherein each of said registers is bounded by a channel stop defining the width of a charge flow channel beneath said gates through which charge flows in said substrate, said channel being constricted beneath said metering gate.

3. The device of claim 1 wherein the extent of said charge transfer gates in the direction of charge flow is on the order of 45 microns and the extent of said metering gate in the direction of charge flow is on the order of 6 microns.

4. The device of claim 1 wherein said reduced effective area is reduced by about a factor of ten.

* * * * *